(12) United States Patent
Sonobe et al.

(10) Patent No.: US 10,840,435 B2
(45) Date of Patent: Nov. 17, 2020

(54) MAGNETIC TUNNEL JUNCTION DEVICE AND MAGNETIC RESISTANCE MEMORY DEVICE

(71) Applicant: SAMSUNG ELECTRONICS CO., LTD., Suwon-si (KR)

(72) Inventors: Yoshiaki Sonobe, Yokohama (JP); Yoshinobu Nakatani, Yokohama (JP)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/528,288

(22) Filed: Jul. 31, 2019

(65) Prior Publication Data

US 2020/0144482 A1    May 7, 2020

(30) Foreign Application Priority Data

Nov. 2, 2018    (JP) .................. 2018-207544

(51) Int. Cl.
*H01L 43/02*    (2006.01)
*H01F 10/32*    (2006.01)
(Continued)

(52) U.S. Cl.
CPC ............ *H01L 43/02* (2013.01); *G11C 11/161* (2013.01); *H01F 10/3272* (2013.01);
(Continued)

(58) Field of Classification Search
CPC ....... H01L 43/02; H01L 27/226; H01L 43/10; H01F 10/3272; H01F 10/3286; G11C 11/161
(Continued)

(56) References Cited

U.S. PATENT DOCUMENTS 7,307,302 B2    12/2007  Saito
7,453,720 B2    11/2008  Ju et al.
(Continued)

FOREIGN PATENT DOCUMENTS

JP    200532878 A    2/2005
JP    2005150303 A    6/2005
(Continued)

OTHER PUBLICATIONS

Mizukami et al., "Fast magnetization precession for perpendicularly magnetized MnAlGe epitaxial films with atomic layered structures", Applied Physics Letters, vol. 103, No. 14, Sep. 30, 2013, 5 pp.

(Continued)

*Primary Examiner* — Caleen O Sullivan
(74) *Attorney, Agent, or Firm* — Myers Bigel, P.A.

(57) ABSTRACT

Provided are a magnetic tunnel junction device and a magnetic resistance memory device which are capable of both reducing a write current and increasing a write speed. The magnetic tunnel junction device includes a free layer having a first magnetization direction that is changeable, a pinned layer that is configured to maintain a second magnetization direction in a predetermined direction, and an insulating layer between the free layer and the pinned layer. The free layer includes a first free layer having perpendicular magnetic anisotropy and high polarizability, and a second free layer that is antiferromagnetic-coupled to the first free layer.

20 Claims, 13 Drawing Sheets

(51) Int. Cl.
*G11C 11/16* (2006.01)
*H01L 27/22* (2006.01)
*H01L 43/10* (2006.01)

(52) U.S. Cl.
CPC ........ *H01F 10/3286* (2013.01); *H01L 27/226* (2013.01); *H01L 43/10* (2013.01)

(58) Field of Classification Search
USPC .......................................................... 257/421
See application file for complete search history.

(56) References Cited

U.S. PATENT DOCUMENTS

| | | | |
|---|---|---|---|
| 8,107,281 | B2 | 1/2012 | Kai et al. |
| 8,878,321 | B2 | 11/2014 | Aikawa et al. |
| 9,184,376 | B2 | 11/2015 | Park et al. |
| 9,349,944 | B2 | 5/2016 | Takahashi et al. |
| 2016/0125924 | A1* | 5/2016 | Kita ................... G11C 11/1673 365/158 |
| 2018/0069173 | A1* | 3/2018 | Sonobe ................. H01L 27/228 |
| 2019/0164587 | A1* | 5/2019 | Machida ............... H01L 27/228 |

FOREIGN PATENT DOCUMENTS

| | | |
|---|---|---|
| JP | 201171352 A | 4/2011 |
| JP | 5002193 B2 | 8/2012 |
| JP | 201436146 A | 2/2014 |
| JP | 2014116474 A | 6/2014 |
| JP | 5542761 B2 | 7/2014 |
| JP | 2015115610 A | 6/2015 |
| JP | 2015126218 A | 7/2015 |
| JP | 201663085 A | 4/2016 |
| JP | 201663087 A | 4/2016 |
| JP | 201663088 A | 4/2016 |
| JP | 201692066 A | 5/2016 |
| JP | 2018133474 A | 8/2018 |

OTHER PUBLICATIONS

Yamada et al., "Reducing the switching current with a Gilbert damping constant in nanomagnets with perpendicular anisotropy", Applied Physics Letters, vol. 106, No. 4, Jan. 26, 2015, 6 pp.

Mizukami et al., "Mn-based hard magnets with small saturation magnetization and low spin relaxation of spintronics", Scripta Materialia, vol. 118, Jun. 2016, pp. 70-74.

* cited by examiner

25  Comparative Example 15A
15
15B

Embodiment 1

MAGNETIC TUNNEL JUNCTION DEVICE AND MAGNETIC RESISTANCE MEMORY DEVICE

CROSS-REFERENCE TO RELATED APPLICATION

This U.S. non-provisional patent application claims priority under 35 U.S.C. § 119 to Japanese Patent Application No. 2018-207544, filed on Nov. 2, 2018, in the Japanese Intellectual Property Office, the disclosure of which is hereby incorporated by reference in its entirety.

BACKGROUND

Embodiments of the inventive concepts relate to a magnetic tunnel junction device and a magnetic resistance memory device.

A magnetic resistance device having perpendicular magnetization may be read by a magnetoresistance effect and may have a high resistance to heat disturbance caused by fine patterns, and thus may be used as a next-generation memory device.

This next-generation memory device may include a magnetic tunnel junction (MTJ) device which has a free layer (also referred to as a memory layer) having a changeable magnetization direction, a pinned layer (also referred to as a reference layer) maintaining a predetermined magnetization direction, and an insulating layer disposed as a tunnel barrier between the free layer and the pinned layer.

A ferromagnetic material having high perpendicular magnetic anisotropy and high spin polarizability may be used as a material of a spin-polarization magnetic layer included in the next-generation memory device. However, it may be difficult to obtain a material having perpendicular magnetic anisotropy and high spin polarizability. In addition, practically, a cobalt-iron-boron (CoFeB) alloy using interfacial magnetic anisotropy may be used as the material having the perpendicular magnetic anisotropy and the high spin polarizability, and the range of selectable materials is very narrow. Thus, it may be difficult to use the material having the high perpendicular magnetic anisotropy and the high spin polarizability.

Meanwhile, a method of coupling a perpendicular magnetization maintaining layer to a memory layer of an MTJ device has been suggested to solve the above limitations.

The perpendicular magnetization maintaining layer may include a cobalt (Co)-based Heusler alloy. Since the cobalt (Co)-based Heusler alloy has high spin polarizability and high Curie temperature, the MTJ device having this alloy may have a large tunnel magnetoresistance ratio. In addition, thermal stability of magnetization of the memory layer to which the perpendicular magnetization maintaining layer including FePt, CoPt, Co/Pt, MnGa, or MnGe is coupled may be improved. Furthermore, an ECC structure or a TcC structure has been suggested. In the ECC structure or the TcC structure, a magnetic coupling control layer may be provided between two magnetic layers to control magnetic coupling between the magnetic layers, and thus thermal stability of magnetization of a memory layer may be maintained and a magnetization inversion current may be reduced. The TcC structure may be a structure in which the Curie temperature of the perpendicular magnetization maintaining layer is reduced. Thermal stability of the TcC structure may be poor at a high use temperature. The TcC structure may have a large gradient of the thermal stability because a high magnetic anisotropy layer having a low Curie temperature (Tc) is used as the perpendicular magnetization maintaining layer.

In addition, for practical use, there may be a demand for an MTJ device which is usable in a wide operating temperature range of −40 degrees Celsius to 150 degrees Celsius and having low power consumption, high-speed inversion (switching) and/or high reliability. For example, a switching current or write current of a nano-magnetic substance having perpendicular magnetization may be reduced.

A write current may be reduced and a write speed may be increased in a magnetic resistance memory device using a magnetic tunnel junction device. However, it may be difficult to reduce the write current and increase the write speed. For example, the write current may increase when a pulse width (Tp) of the write current is reduced.

SUMMARY

Embodiments of the inventive concepts may provide a magnetic tunnel junction device and a magnetic resistance memory device, which are capable of both reducing a write current and increasing a write speed.

In some embodiments, a magnetic tunnel junction device may include a free layer configured to have a first magnetization direction that is changeable, a pinned layer that is configured to maintain a second magnetization direction in a predetermined direction, and an insulating layer between the free layer and the pinned layer. The free layer may include a first free layer having perpendicular magnetic anisotropy and high polarizability, and a second free layer that is antiferromagnetic-coupled to the first free layer.

In the magnetic tunnel junction device according to some embodiments, a write current may be reduced and a write speed may be increased.

In some embodiments, the first free layer may be provided between the insulating layer and the second free layer, and magnetic anisotropy of the second free layer may be less than magnetic anisotropy of the first free layer.

In some embodiments, the first free layer may be provided between the insulating layer and the second free layer, and the second free layer may be a second thickness that is less than a first thickness of the first free layer.

In the magnetic tunnel junction device according to some embodiments, the write current may be reduced in a region where damping coefficients of the first and second free layers are small. The second free layer may be thinner than the first free layer, and thus the write current may be reduced in the region where the damping coefficients of the first and second free layers are small.

In some embodiments, the first free layer may be provided between the insulating layer and the second free layer, and the first free layer may be a first thickness that is less than a second thickness of the second free layer.

In the magnetic tunnel junction device according to some embodiments, the write current may be reduced and the write speed may be increased, by the small damping coefficients and a combination of a material of the first free layer and a material of the second free layer.

In some embodiments, an antiferromagnetic (AFC) control layer controlling antiferromagnetic coupling may be between the first free layer and the second free layer.

In some embodiments, the AFC control layer may be a magnetic layer having a thickness of 2 nm or less.

In some embodiments, the AFC control layer may include at least one of MnGa, Ru, Ir, MgO, Pt, Co, Pd, W, or Ta.

In the magnetic tunnel junction device according to some embodiments, the write current may be reduced and the write speed may be increased, by the free layer having a small perpendicular magnetic anisotropy constant (Ku).

In some embodiments, a magnetic resistance memory device may include a magnetic tunnel junction device including a free layer that is configured to have a first magnetization direction that is changeable, a pinned layer that is configured to maintain a second magnetization direction in a predetermined direction, and an insulating layer between the free layer and the pinned layer, and an electrode for applying a voltage to the magnetic tunnel junction device. The free layer may include a first free layer having perpendicular magnetic anisotropy and high polarizability, and a second free layer antiferromagnetic-coupled to the first free layer. The magnetic resistance memory device may include an electrode configured to receive a voltage to apply to the magnetic tunnel junction device.

In some embodiments, a memory cell of a magnetic resistance memory device may include a magnetic tunnel junction device. The magnetic tunnel junction device includes a first layer with high spin polarization and a second layer with perpendicular magnetization.

In the magnetic resistance memory device according to some embodiments, the write current may be reduced and the write speed may be increased.

BRIEF DESCRIPTION OF THE DRAWINGS

The inventive concepts will become more apparent in view of the attached drawings and accompanying detailed description.

DETAILED DESCRIPTION

Figure 1:
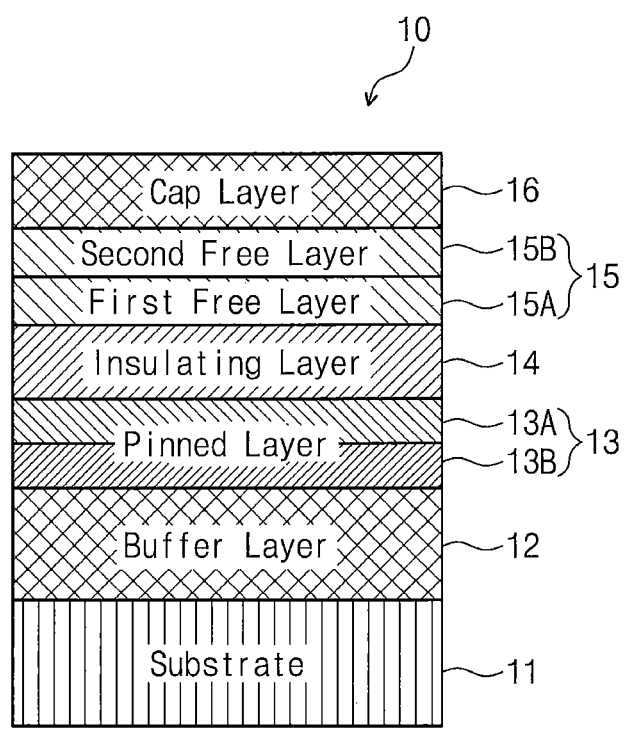
FIG. 1 is a cross-sectional view illustrating components of a magnetic tunnel junction device, according to some embodiments.

Hereinafter, embodiments of the inventive concepts will be described in detail with reference to the accompanying drawings. FIG. 1 is a cross-sectional view illustrating components of a magnetic tunnel junction device according to some embodiments. A magnetic tunnel junction device 10 may include a substrate 11, a buffer layer 12, a pinned layer 13, an insulating layer 14, a free layer 15, and a cap layer 16.

The substrate 11 may be a silicon (Si) substrate. In some embodiments, the substrate 11 may be a silicon (Si) substrate having a thermal oxide layer, or a single-crystalline silicon (Si) substrate.

The buffer layer 12 may be a stabilization layer formed on the substrate 11. For example, the buffer layer 12 may include ruthenium (Ru), chromium (Cr), tantalum (Ta), gold (Au), tungsten (W), platinum (Pt), or titanium (Ti).

The pinned layer 13 may be a layer maintaining its magnetization direction in a predetermined direction. A material of which a magnetization direction is not easily changed as compared with the free layer 15 may be selected as the pinned layer 13. In other words, the pinned layer 13 may include at least one selected from materials, each of which may have a relatively large effective magnetic anisotropy (Kueff), a relatively large saturation magnetization (Ms), and/or a relatively large magnetic relaxation constant (i.e., damping coefficient, $\alpha$) compared to the free layer 15.

However, the material of the pinned layer 13 is not limited thereto. In some embodiments, the material of the pinned layer 13 may be selected from other various materials in consideration of various conditions. For example, the pinned layer 13 may include a first layer 13A mainly composed of CoFeB and a second layer 13B corresponding to a Co/Pt multi-layer. The first layer 13A may be mainly composed of a Heusler alloy layer. For example, the first layer 13A may be mainly composed of a cobalt (Co)-based full-Heusler alloy. For example, the Co-based full-Heusler alloy may be $Co_2FeSi$, $Co_2MnSi$, $Co_2FeMnSi$, $Co_2FeAl$, or $Co_2CrAl$. The second layer 13B may be formed to have a great perpendicular magnetic anisotropy. As illustrated in FIG. 1, the first layer 13A mainly composed of the Heusler alloy layer may be in contact with the insulating layer 14, and the second layer 13B may be in contact with the buffer layer 12. Since the pinned layer 13 is formed as described above, the pinned layer 13 may maintain a magnetization direction of a single layer in a predetermined direction. The pinned layer 13 may also be referred to as a reference layer.

The insulating layer 14 may be mainly composed of an insulating material. The insulating layer 14 may be a layer having (001) texture. The insulating layer 14 may be between the pinned layer 13 and the free layer 15, which are ferromagnetic. The insulating layer 14 may be formed of an insulating material such as MgO. In addition, an oxide having a NaCl structure may be used as a material of the insulating layer 14. For other examples, the insulating layer 14 may include CaO, SrO, TiO, VO, or NbO, in addition to MgO described above. However, the material of the insulating layer 14 is not limited thereto but may include at least one of other various materials having insulation properties. For example, the insulating layer 14 may include spinel-type $MgAl_2O_4$. A voltage may be applied in a direction substantially perpendicular to junction surfaces of the pinned layer 13 and the free layer 15, and thus a current may flow through the magnetic tunnel junction device 10 by a tunneling effect.

The free layer 15 may have an easy axis of magnetization which is in a direction substantially perpendicular to a surface of the free layer 15. A magnetization direction of the free layer 15 may be changeable by magnetization rotation. The free layer 15 may include a first free layer 15A and a second free layer 15B. The free layer 15 may also be referred to as a memory layer or a storage layer.

The first free layer 15A may have perpendicular magnetic anisotropy and high polarizability.

The second free layer 15B may be antiferromagnetic-coupled to the first free layer 15A.

The cap layer 16 may be a stabilization layer formed on the free layer 15. For example, the cap layer 16 may include ruthenium (Ru).

The magnetic tunnel junction device of some embodiments may be formed as described above.

Figure 2:
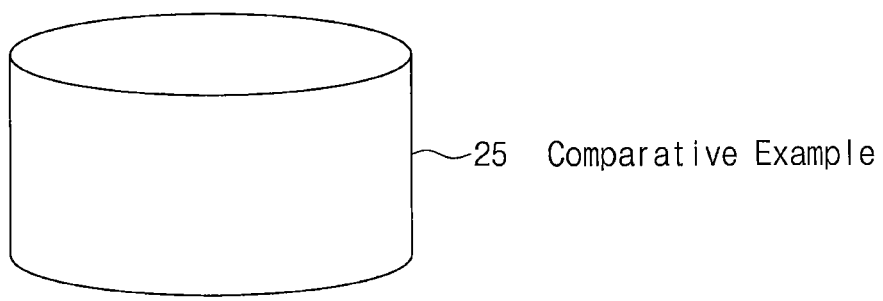
FIG. 2 is a view illustrating a model of a free layer of a comparative example and a model of a free layer, according to some embodiments.
Figure 2:
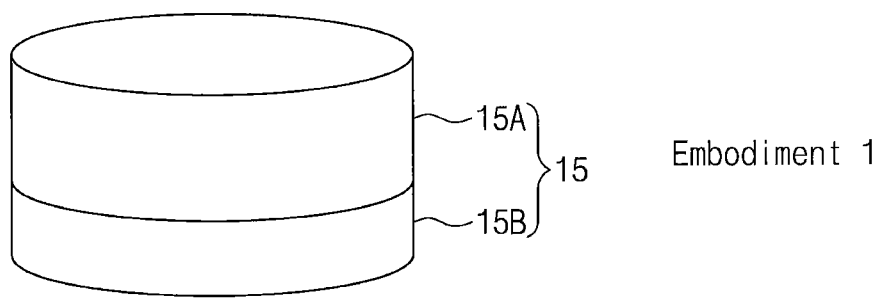

Next, an effect of the magnetic tunnel junction device of some embodiments will be described using a comparative example. FIG. 2 illustrates a model of a free layer of a comparative example and a model of a free layer of some embodiments. In FIG. 2, a free layer 25 of the comparative example consists of a single ferromagnetic layer. In FIG. 2, the free layer 15 of some embodiments has at least two layers, including the first free layer 15A and the second free layer 15B. The first free layer 15A and the second free layer 15B are antiferromagnetic-coupled to each other.

Calculations for the free layer 25 of the comparative example and the free layer 15 of some embodiments were performed under the following conditions of calculation.

Conditions of Calculation
Comparative Example (Single-Layered Free Layer 25)
  Shape: Disk
  Diameter: 30 nm
  Thickness: 2 nm
Experimental Example 1 (First Free Layer 15A and Second Free Layer 15B)
  Shape: Disk
  Diameter: 30 nm
  Thickness: First free layer 15A: 1 nm
    Second free layer 15B: 1 nm
Material Constants (Comparative Example and Experimental Example 1: Commonness)
  Saturation magnetization (Ms) of first free layer 15A: 600 emu/cm$^3$
  Saturation magnetization (Ms2) of second free layer 15B: 300 emu/cm$^3$
  Magnetic exchange stiffness coupling constant: $A=1\times 10^{-6}$ erg/cm
  Antiferromagnetic coupling constant: $A_{IL}=-1\times 10^{-6}$ erg/cm
  Damping coefficient: $\alpha=0.001\sim 1.0$
  Perpendicular Magnetic Anisotropy Constant (Ku):
  Comparative example (single-layered free layer 25): 3.48 Merg/cm$^3$
  Experimental example 1 (first free layer 15A): 3.08 Merg/cm$^3$
  Experimental example 1 (second free layer 15B): 3.08 Merg/cm$^3$ In addition, a thermal stability index ($\Delta$KuV/kt) was set to 60. Here, 'k' is the Boltzmann constant, and 't' is a temperature.

Figure 3:
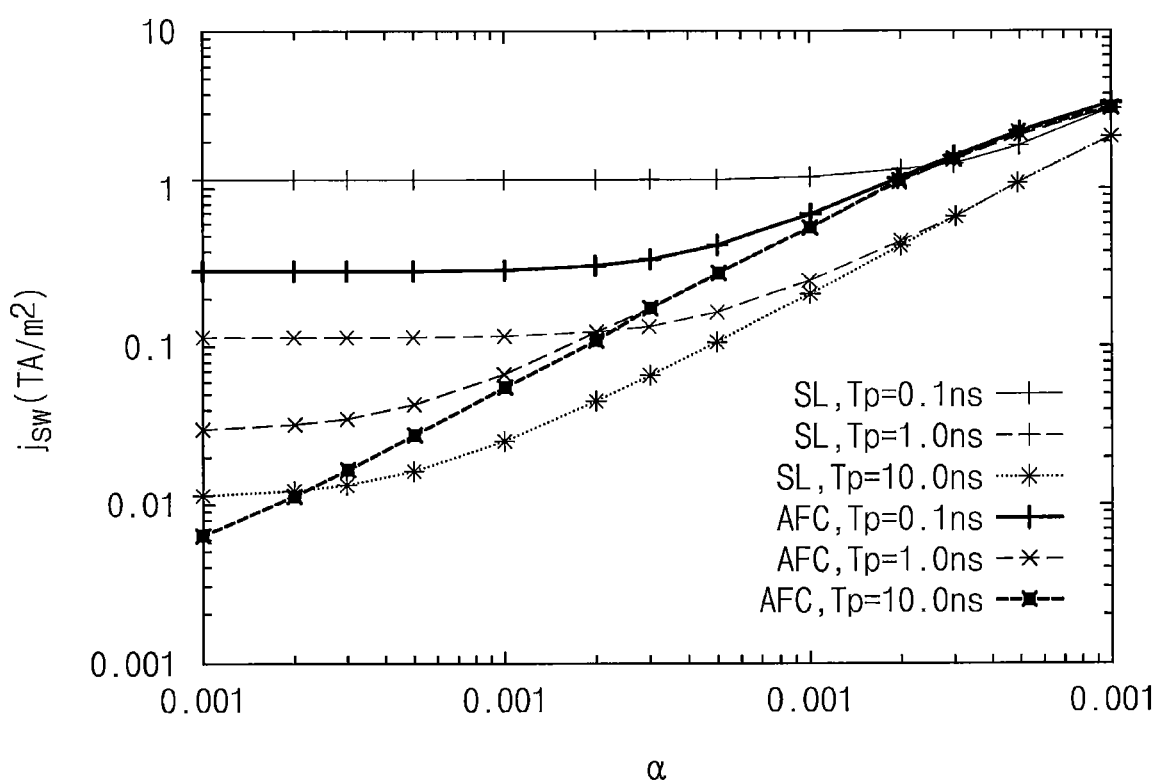
FIG. 3 is a graph showing relation between a damping coefficient and a current density, according to some embodiments.

The relation between the damping coefficient and a current density was calculated under the above conditions, and calculated results were shown in FIG. 3. FIG. 3 is a graph showing the relation between a damping coefficient ($\alpha$) and a current density. FIG. 3 shows results calculated while changing a pulse width Tp of a current flowing through the free layer.

In FIG. 3, a horizontal axis represents the damping coefficient ($\alpha$), and a vertical axis represents the current density ($j_{sw}$). In FIG. 3, 'SL' indicates a single layer, i.e., the case in which the free layer is the single-layered free layer 25 (the comparative example of FIG. 2). 'AFC' indicates antiferromagnetic coupling, i.e., the case in which the free layer has the first free layer 15A and the second free layer 15B. 'Tp' indicates the pulse width of the current flowing through the free layer.

As shown in FIG. 3, under the same pulse width Tp, the current density of the experimental example 1 is reduced as compared with that of the comparative example.

Thus, according to the magnetic tunnel junction device of the experimental example 1, the free layer 15 may have the first free layer 15A and the second free layer 15B antiferromagnetic-coupled to the first free layer 15A, and thus a write current may be reduced.

Figure 4:
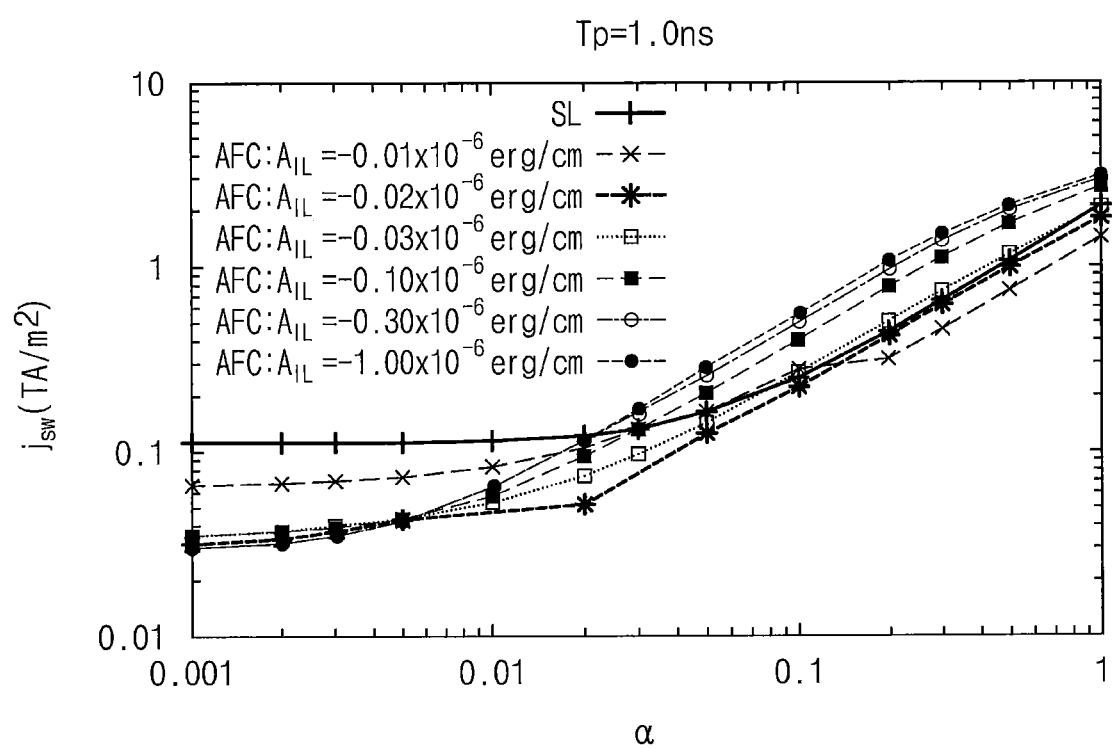
FIG. 4 is a graph showing relation between a damping coefficient and a current density, according to some embodiments.

Next, calculated results of relation between a damping coefficient and a current density are shown in FIG. 4. FIG. 4 is a graph showing relation between a damping coefficient and a current density. FIG. 4 shows results calculated while changing the condition of the antiferromagnetic coupling constant of the first free layer 15A and/or the second free layer 15B.

In FIG. 4, a horizontal axis represents the damping coefficient, and a vertical axis represents the current density. 'AFC' indicates antiferromagnetic coupling, i.e., the case in which the free layer has the first free layer 15A and the second free layer 15B (the experimental example 1). '$A_{IL}$' indicates the antiferromagnetic coupling constant (coupling exchange constant) of the first free layer 15A and the second free layer 15B. In addition, the calculated results of FIG. 4 were obtained when a pulse width Tp of a current flowing through the free layer was set to 1.0 ns.

As shown in FIG. 4, when the antiferromagnetic coupling constant $A_{IL}$ is low (an absolute value of a negative value is large), the current density is low in a region where the damping coefficient is small. When the antiferromagnetic coupling constant $A_{IL}$ is high (an absolute value of a negative value is small), the current density is low in a region where the damping coefficient is large.

Thus, optimum values of the damping coefficient and the current density may be determined when the antiferromagnetic coupling constant $A_{IL}$ has a substantially optimum value. In other words, the write current may be reduced and a write speed may be increased.

As described above, according to the magnetic tunnel junction device 10 of some embodiments, the free layer 15 may include the first free layer 15A and the second free layer 15B antiferromagnetic-coupled to the first free layer 15A, and thus the write current may be reduced and the write speed may be increased. In the magnetic tunnel junction device 10 of some embodiments, since the first free layer 15A and the second free layer 15B are antiferromagnetic-coupled to each other, a magnetization amount of the entire free layer 15 may be reduced and the write current may be reduced. For example, when the antiferromagnetic coupling constant $A_{IL}$ is low, the write current may be reduced in a region where the damping coefficients of the first and second free layers 15A and 15B are small.

In some embodiments, the second free layer 15B of may be thinner than the first free layer 15A. In other words, the first free layer 15A close to the insulating layer 14 may be thicker than the second free layer 15B.

Figure 5:
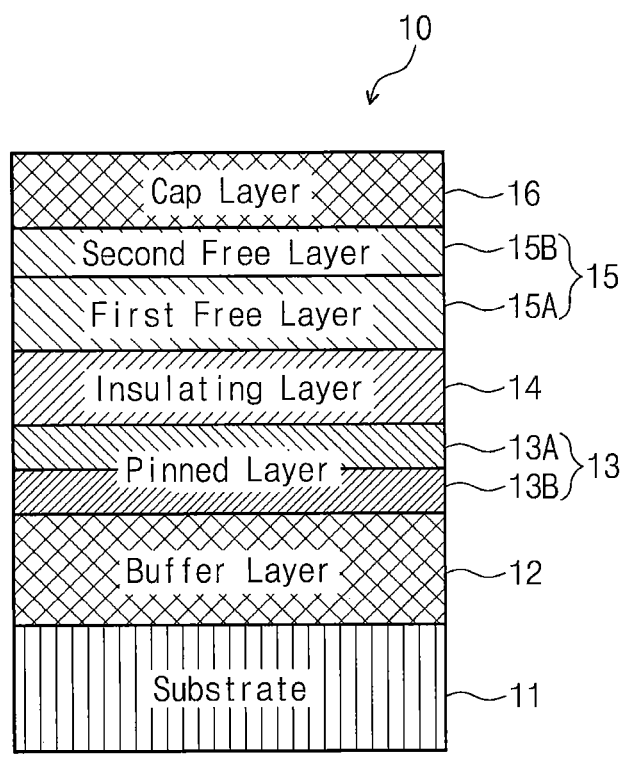
FIG. 5 is a cross-sectional view illustrating components of a magnetic tunnel junction device according to some embodiments.

FIG. 5 is a cross-sectional view schematically illustrating components of a magnetic tunnel junction device according to some embodiments.

A magnetic tunnel junction device 10 may include a substrate 11, a buffer layer 12, a pinned layer 13, an insulating layer 14, a free layer 15, and a cap layer 16. In FIG. 5, the similar components or elements as in FIG. 1 will be indicated by the same reference numerals or designators, and the descriptions thereto will be omitted.

A magnetization direction of the free layer 15 may be changeable. The free layer 15 may include a first free layer 15A and a second free layer 15B.

In some embodiments, the first free layer 15A may be provided between the insulating layer 14 and the second free layer 15B, and the second free layer 15B may be thinner than the first free layer 15A. A magnetic anisotropy constant (Ku) of the first free layer 15A may be greater than a magnetic anisotropy constant (Ku) of the second free layer 15B.

Relation between a damping coefficient and a current density was calculated using a micro magnetic simulation based on the Landau-Lifshitz-Gilbert (LLG) equation.
Conditions of Calculation
Comparative Example (Single-Layered Free Layer 25 of FIG. 2)
  Shape: Disk
  Diameter: 30 nm
  Thickness: 3 nm
  Experimental Example 2 (First Free Layer 15A and Second Free Layer 15B)
  Shape: Disk
  Diameter: 30 nm
  Thickness: First free layer 15A: 3 nm
    Second free layer 15B: 0.5 nm~2.5 nm
  Material Constants (Comparative Example and Experimental Example 2: Commonness)
    Saturation magnetization (Ms) of first free layer 15A: 600 emu/cm$^3$
    Saturation magnetization (Ms2) of second free layer 15B: 600 emu/cm$^3$
    Magnetic exchange stiffness coupling constant: A=1×10$^{-6}$ erg/cm
    Antiferromagnetic coupling constant: $A_{IL}$=−1×10$^{-6}$ erg/cm
    Damping coefficient: α=0.001~1.0
    Perpendicular magnetic Anisotropy Constant (Ku):
    Comparative example (single-layered free layer 25): 2.72 Merg/cm$^3$
    Experimental example 2 First free layer 15A:
      3.24 Merg/cm$^3$ (Thickness Hs of second free layer 15B=0.5 nm)
      3.70 Merg/cm$^3$ (Hs=1.0 nm)
      4.10 Merg/cm$^3$ (Hs=1.5 nm)
      4.44 Merg/cm$^3$ (Hs=2.0 nm)
      4.76 Merg/cm$^3$ (Hs=2.5 nm)
    Second free layer 15B:
      0 Merg/cm$^3$ (Hs=0.5 nm~2.5 nm)

Figure 6:
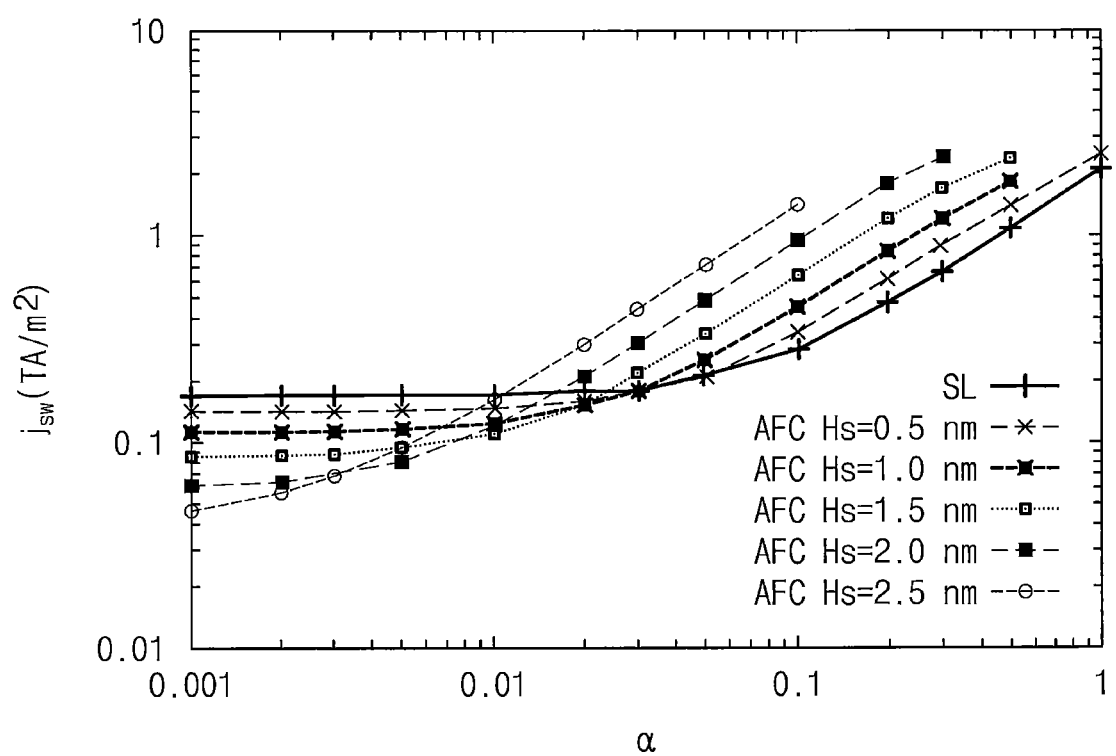
FIG. 6 is a graph showing relation between a damping coefficient and a current density, according to some embodiments.

Relation between the damping coefficient and the current density was calculated under the above conditions, and calculated results were shown in FIG. 6. FIG. 6 is a graph showing relation between a damping coefficient and a current density. FIG. 6 shows results calculated while changing the thickness Hs of the second free layer 15B in a range from 0.5 nm to 2.5 nm.

In FIG. 6, a horizontal axis represents the damping coefficient, and a vertical axis represents the current density.

In FIG. 6, 'SL' indicates a single layer, i.e., the case in which the free layer is the single-layered free layer 25 (the comparative example). 'AFC' indicates antiferromagnetic coupling, i.e., the case in which the free layer has the first free layer 15A and the second free layer 15B (the experimental example 2). A pulse width of a current flowing through the free layer was set to 1.0 ns.

FIG. 6 shows the example in which the thickness (H) of the first free layer 15A is 3 nm. However, an example in which the thickness (H) of the first free layer 15A is 2 nm or 5 nm will be described below.

Figure 7:
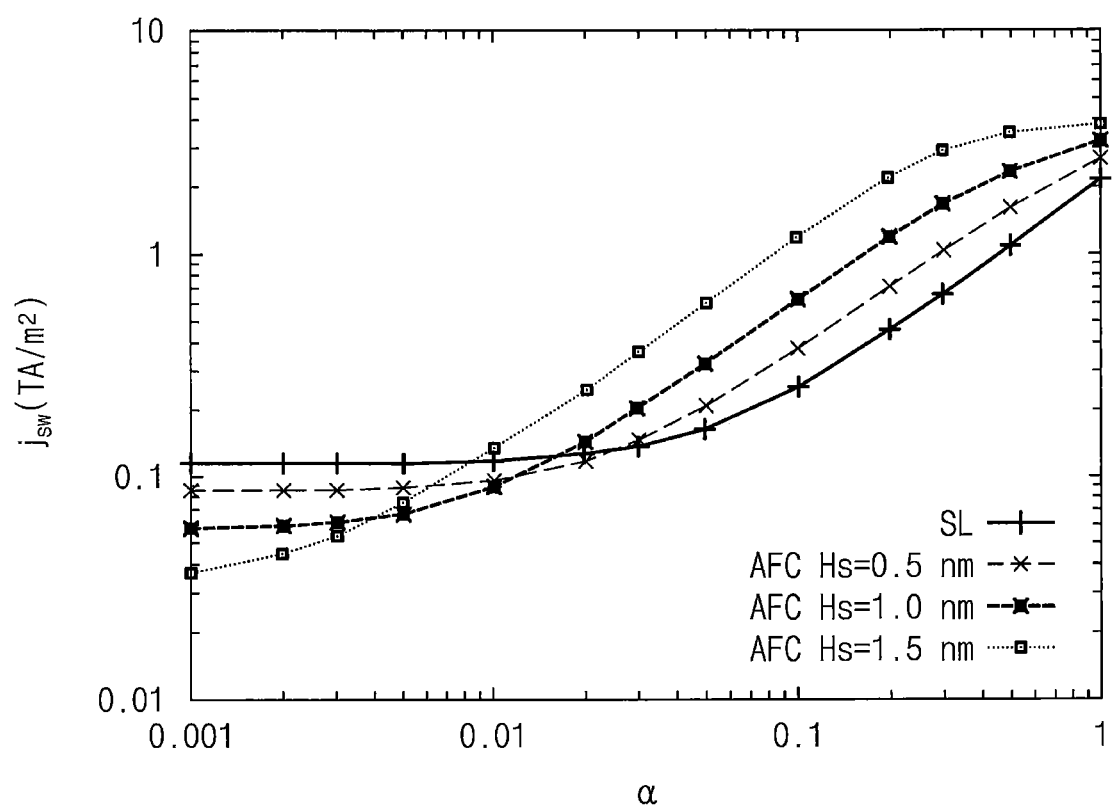
FIG. 7 is a graph showing relation between a damping coefficient and a current density, according to some embodiments.
Figure 8:
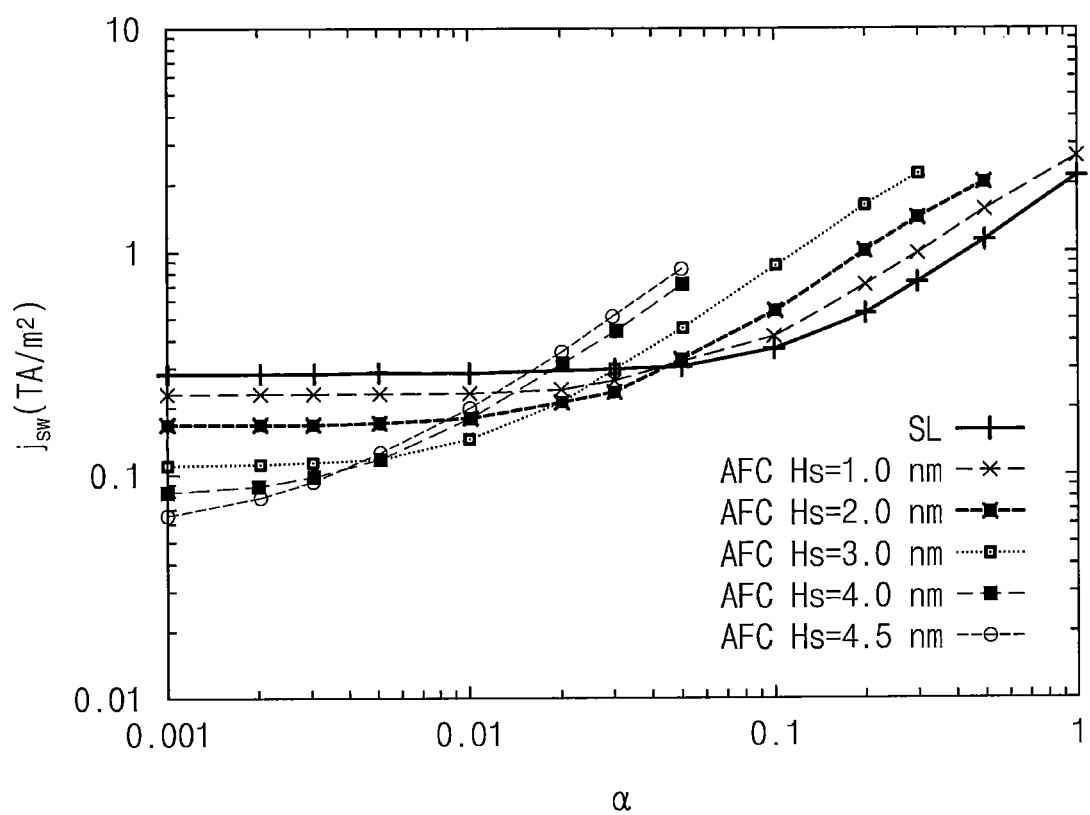
FIG. 8 is a graph showing relation between a damping coefficient and a current density, according to some embodiments.

FIGS. 7 and 8 are graphs showing relations between a damping coefficient and a current density. FIG. 7 shows a graph under a condition that the thickness (H) of the first free layer 15A is 2 nm. FIG. 7 shows results calculated while changing the thickness Hs of the second free layer 15B in a range from 0.5 nm to 1.5 nm.

FIG. 8 shows a graph under a condition that the thickness (H) of the first free layer 15A is 5 nm. FIG. 8 shows results calculated while changing the thickness Hs of the second free layer 15B in a range from 1.0 nm to 4.5 nm.

In FIGS. 7 and 8, other conditions except the thickness (H) of the first free layer 15A and the thickness Hs of the second free layer 15B are the same as corresponding conditions of FIG. 6. A thermal stability index (ΔKuV/kt) was set to 60.

Figure 9:
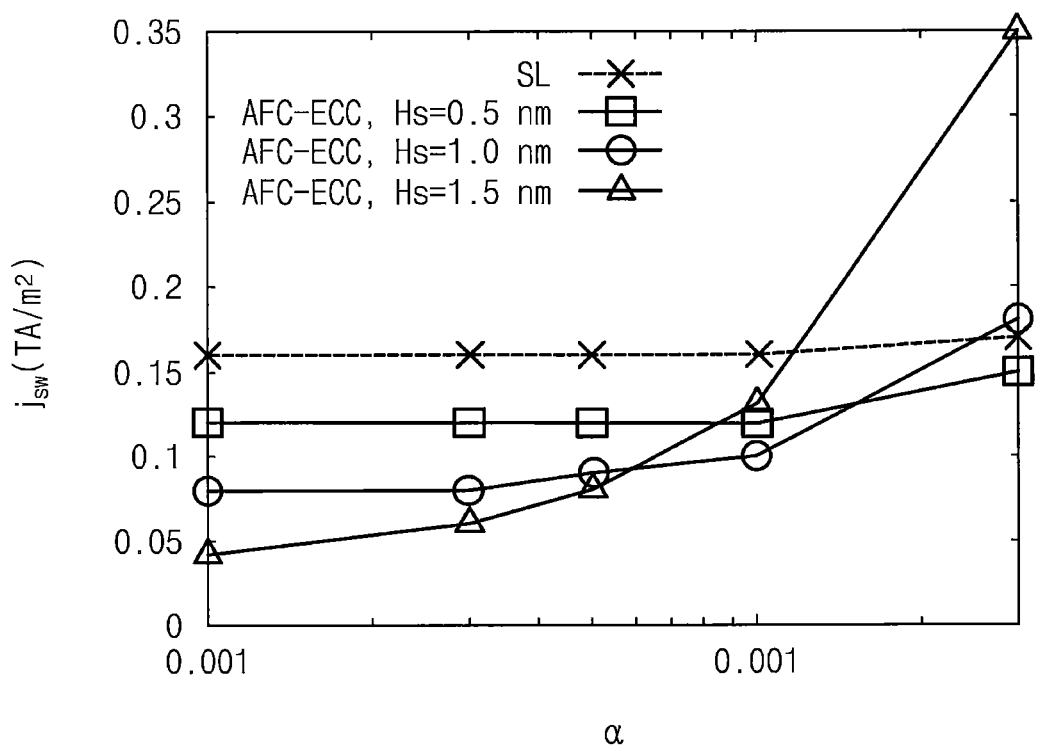
FIG. 9 is a graph showing relation between a damping coefficient and a current density, according to some embodiments.

An example in which the saturation magnetization (Ms) of the first free layer 15A and the saturation magnetization (Ms2) of the second free layer 15B are 800 emu/cm$^3$ is shown in FIG. 9. In FIG. 9, a horizontal axis represents the damping coefficient, and a vertical axis represents the current density. In the example of FIG. 9, other conditions except the saturation magnetization are the same as corresponding conditions of FIG. 7. A thermal stability index (ΔKuV/kt) was set to 60.

As shown in FIGS. 6 to 9, the current density of the experimental example 2 is lower than the current density of the comparative example in a region where the damping coefficient is small. Thus, the write current may be reduced and the write speed may be increased, by the perpendicular magnetic anisotropy constant (Ku) of the first free layer 15A higher than the perpendicular magnetic anisotropy constant (Ku) of the second free layer 15B, the small damping coefficient, and/or the combination of the material of the first free layer 15A and the material of the second free layer 15B. In addition, relation between the damping coefficient and the perpendicular magnetic anisotropy constant (Ku), which is determined by a material, is shown in S. Mizukami, et al., Appl. Phys. Lett. 103, 142405 (2013) and S. Mizukami, et al., Scripta Mater. 118, 70 (2016).

As described above, according to the magnetic tunnel junction device 10 of some embodiments, the magnetic anisotropy constant of the second free layer 15B may be smaller than the magnetic anisotropy constant of the first free layer 15A, and thus the write current may be reduced in a region where the damping coefficients of the first and second free layers 15A and 15B are small. According to the magnetic tunnel junction device 10 of some embodiments, the second free layer 15B may be thinner than the first free layer 15A, and thus the write current may be reduced in the region where the damping coefficients of the first and second free layers 15A and 15B are small.

In addition, according to the magnetic tunnel junction device 10 of some embodiments, the write current may be reduced and the write speed may be increased, by the small damping coefficient and/or the combination of the material of the first free layer 15A and the material of the second free layer 15B.

In some embodiments, an AFC control layer for controlling antiferromagnetic coupling may be provided between the first free layer 15A and the second free layer 15B of some embodiments.

Figure 10:
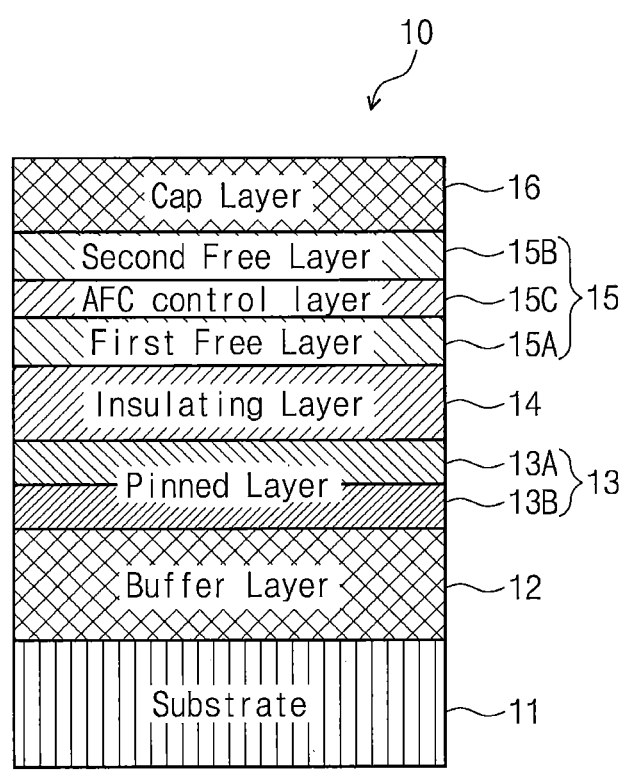
FIG. 10 is a cross-sectional view illustrating components of a magnetic tunnel junction device according to some embodiments.

FIG. 10 is a cross-sectional view schematically illustrating components of a magnetic tunnel junction device according to some embodiments. A magnetic tunnel junction device 10 may include a substrate 11, a buffer layer 12, a pinned layer 13, an insulating layer 14, a free layer 15, and a cap layer 16.

A magnetization direction of the free layer 15 may be changeable. The free layer 15 may include a first free layer 15A, an AFC control layer 15C, and a second free layer 15B.

The AFC control layer 15C may control antiferromagnetic coupling of the first free layer 15A and/or the second free layer 15B. The AFC control layer 15C may be between the first free layer 15A and the second free layer 15B. For example, the AFC control layer 15C may include at least one of MnGa, Ru, Ir, MgO, Pt, Co, Pd, W, or Ta. Parameters (e.g., a resistance change rate, thermal stability, a write current, and a magnetization inversion speed) may be optimized by appropriately adjusting a thickness (i.e., a magnitude of magnetic coupling) of the AFC control layer 15C to 2 nm or less. Thus, the AFC control layer 15C may have a structure having a Ruderman-Kittel-Kasuya-Yosida (RKKY) interaction. In addition, when the AFC control layer 15C uses Ru and Ir, a magnetization of the entire free layer 15 may be reduced and the magnetization inversion speed may be increased.

As described above, according to the magnetic tunnel junction device 10 of some embodiments, the magnitude of the antiferromagnetic coupling may be optimized by providing the AFC control layer 15C for controlling the antiferromagnetic coupling between the first and second free layers 15A and 15B antiferromagnetic-coupled to each other and by changing the material and the thickness of the AFC control layer 15C, and thus the write current may be reduced and the write speed may be increased.

In some embodiments, the first free layer 15A of may be thinner than the second free layer 15B. In other words, the first free layer 15A close to the insulating layer 14 may be thinner than the second free layer 15B.

Figure 11:
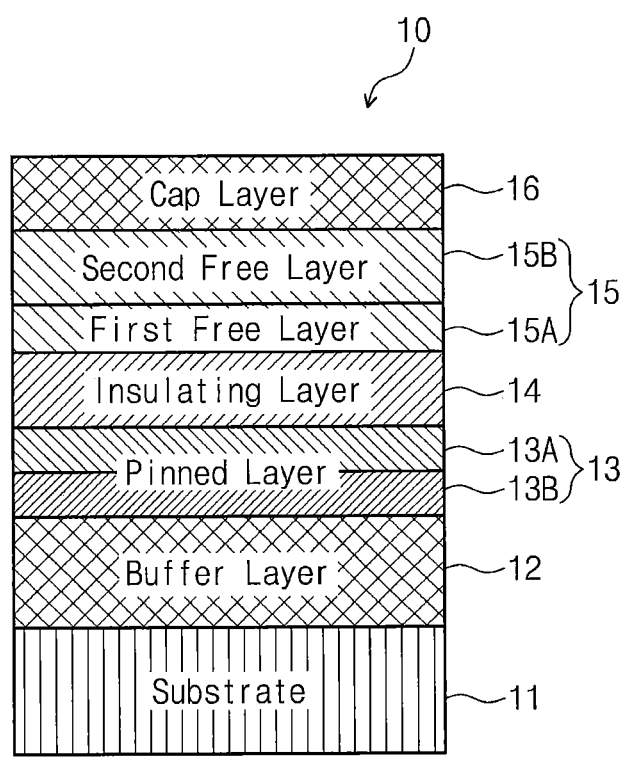
FIG. 11 is a cross-sectional view illustrating components of a magnetic tunnel junction device according to some embodiments.

FIG. 11 is a cross-sectional view schematically illustrating components of a magnetic tunnel junction device according to some embodiments. A magnetic tunnel junction device 10 may include a substrate 11, a buffer layer 12, a pinned layer 13, an insulating layer 14, a free layer 15, and a cap layer 16. In FIG. 11, the same components or elements as in FIG. 1 will be indicated by the same reference numerals or designators, and the descriptions thereto will be omitted.

A magnetization direction of the free layer 15 may be changeable. The free layer 15 may include a first free layer 15A and a second free layer 15B.

In some embodiments, the first free layer 15A may be provided between the insulating layer 14 and the second free layer 15B, and the first free layer 15A may be thinner than the second free layer 15B.

Figure 12:
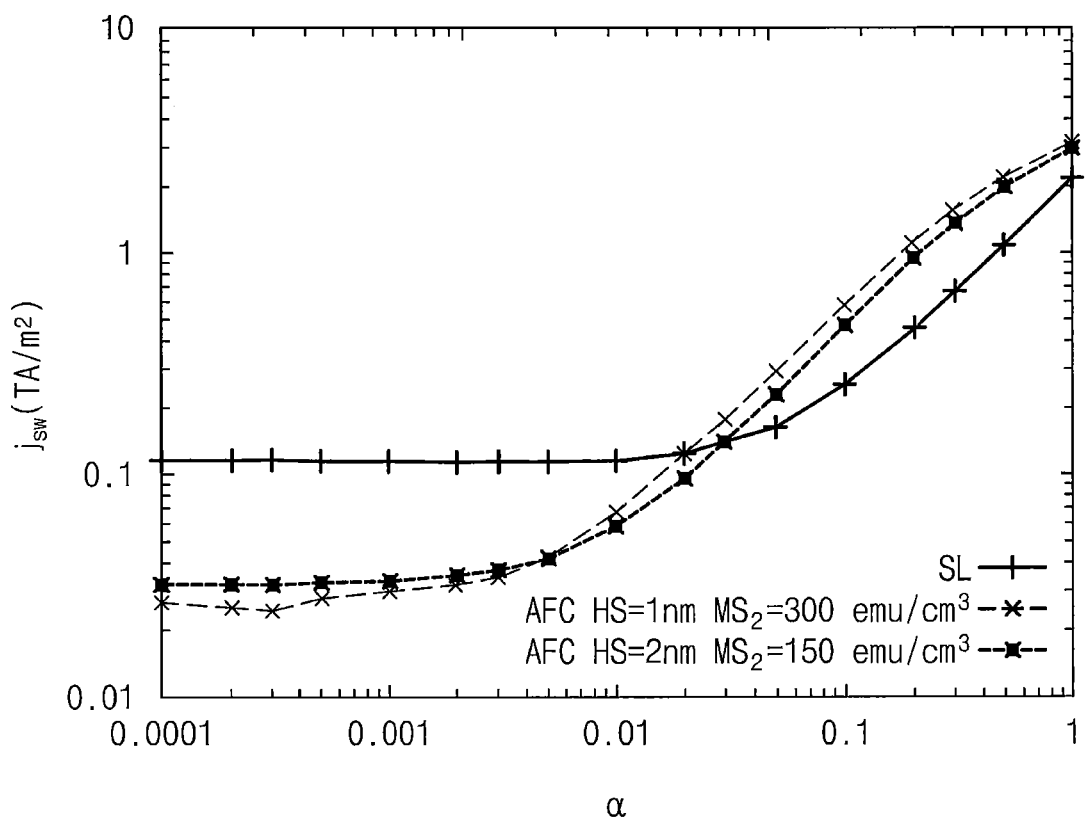
FIG. 12 is a graph showing relation between a damping coefficient and a current density, according to some embodiments.

Relation between a damping coefficient and a current density was calculated using a micro magnetic simulation based on the LLG equation.
Conditions of Calculation
Comparative Example (Single-Layered Free Layer 25 of FIG. 2)
Shape: Disk
Diameter: 30 nm
Thickness: 2 nm
Experimental Example 3 (First Free Layer 15A and Second Free Layer 15B)
Shape: Disk
Diameter: 30 nm
Thickness: First free layer 15A: 1 nm
Second free layer 15B: 1 nm, 2 nm
Material Constants (Comparative Example and Experimental Example 3: Commonness)
Saturation magnetization (Ms) of first free layer 15A: 600 emu/cm$^3$
Saturation magnetization (Ms2) of second free layer 15B: 300 emu/cm$^3$, 150 emu/cm$^3$
Magnetic exchange stiffness coupling constant: $A = 1 \times 10^{-6}$ erg/cm
Antiferromagnetic coupling constant: $A_{IL} = -1 \times 10^{-6}$ erg/cm
Damping coefficient: $\alpha = 0.001 \sim 1.0$
Perpendicular Magnetic Anisotropy Constant (Ku):
Comparative example (single-layered free layer): 3.48 Merg/cm$^3$
Experimental example 3 (first free layer 15A and second free layer 15B): 1.96 Merg/cm$^3$ The relation between the damping coefficient and a current density was calculated under the above conditions, and calculated results were shown in FIG. 12. FIG. 12 is a graph showing the relation between a damping coefficient and a current density. FIG. 12 shows results calculated while changing the thickness Hs of the second free layer 15B in a range from 1 nm to 2 nm.

In FIG. 12, a horizontal axis represents the damping coefficient, and a vertical axis represents the current density. In FIG. 12, 'SL' indicates a single layer, i.e., the case in which the free layer is the single-layered free layer 25 (the comparative example of FIG. 2). 'AFC' indicates antiferromagnetic coupling, i.e., the case in which the free layer has the first free layer 15A and the second free layer 15B (the experimental example 3). A pulse width of a current flowing through the free layer was set to 1.0 ns.

As shown in FIG. 12, the current density of the experimental example 3 is lower than the current density of the comparative example in a region where the damping coefficient is small. In particular, the perpendicular magnetic anisotropy constant (Ku) of the first free layer 15A and the second free layer 15B may be reduced.

As described above, according to the magnetic tunnel junction device 10 of some embodiments, the first free layer 15A may be thinner than the second free layer 15B, and thus the write current may be reduced and the write speed may be increased, in the region where the damping coefficients of the first and second free layers 15A and 15B are small. In addition, according to the magnetic tunnel junction device 10 of some embodiments, the write current may be reduced and the write speed may be increased, by the free layer 15 having the small perpendicular magnetic anisotropy constant (Ku).

According to some embodiments, a magnetic resistance memory device using at least one of the magnetic tunnel junction devices will be described.

Figure 13:
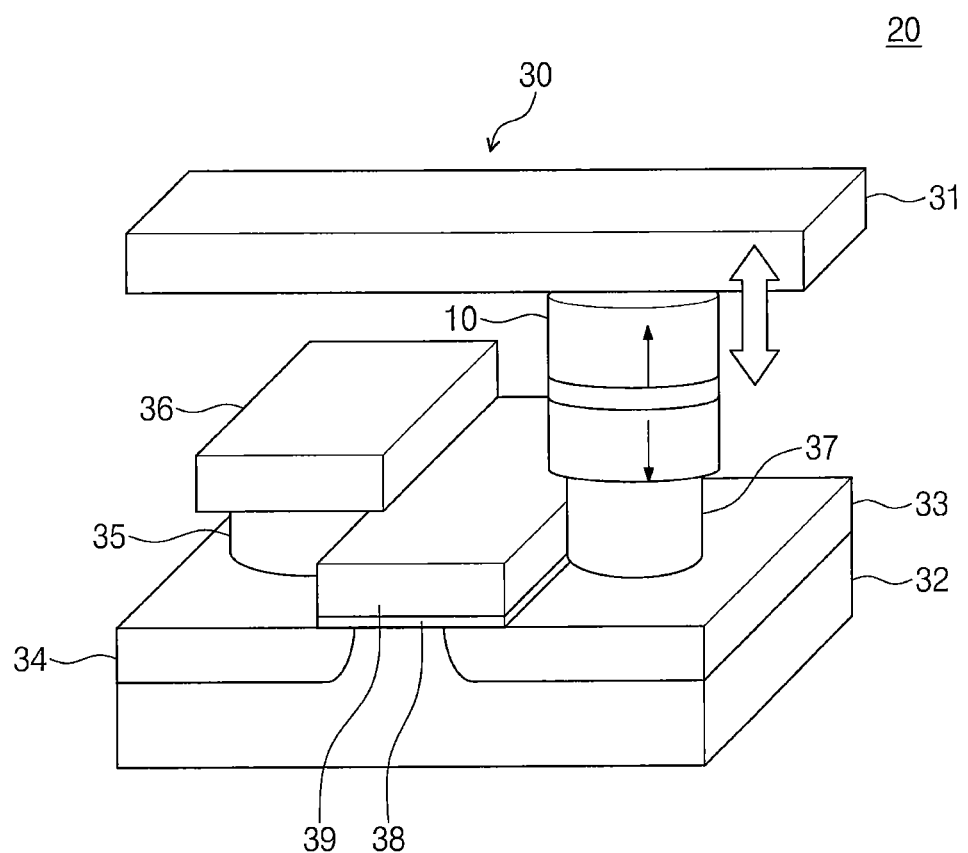
FIG. 13 is a perspective view illustrating a main portion of an example of a magnetic resistance memory device, according to some embodiments.

FIG. 13 is a perspective view illustrating a main portion of an example of a magnetic resistance memory device according to some embodiments.

In FIG. 13, a magnetic resistance memory device 20 may include a memory cell 30, a bit line 31, contact plugs 35 and 37, and a word line 38.

The memory cell 30 may include a semiconductor substrate 32, diffusion regions 33 and 34, a source line 36, a gate insulating layer 39, and a magnetic tunnel junction device 10. The magnetic tunnel junction device 10 may correspond to the magnetic tunnel junction device 10 of embodiments described herein. In the magnetic resistance memory device 20, a plurality of the memory cells 30 may be arranged in a matrix and may be connected to a plurality of the bit lines 31 and a plurality of the word lines 38. The magnetic resistance memory device 20 (e.g., MRAM) may perform a write operation of data by a spin torque injection method.

The semiconductor substrate 32 may have the diffusion regions 33 and 34 at its surface, and the diffusion region 33 may be spaced apart from the diffusion region 34 by a predetermined distance. The diffusion region 33 may function as a drain region, and the diffusion region 34 may function as a source region. The diffusion region 33 may be connected to the magnetic tunnel junction device 10 with the contact plug 37 interposed therebetween.

The bit line 31 may be overlapping the semiconductor substrate 32 and may be connected to the magnetic tunnel junction device 10. The bit line 31 may be connected to a write circuit (not shown) and a read circuit (not shown).

The diffusion region 34 may be connected to the source line 36 with the contact plug 35 interposed therebetween. The source line 36 may be connected to the write circuit (not shown) and the read circuit (not shown).

The word line 38 may be on the semiconductor substrate 32 with the gate insulating layer 39 interposed therebetween and may be adjacent to the diffusion regions 33 and 34. The word line 38 and the gate insulating layer 39 may function as a selection transistor. The word line 38 may be turned-on as the selection transistor by a current supplied from a circuit (not shown).

A voltage may be applied to the magnetic tunnel junction device 10 through the bit line 31 and the diffusion region 33. The bit line 31 and the diffusion region 33 may function as an electrode. A torque of spins of electrons parallel to a certain direction by the applied voltage may change a magnetization direction of the ferromagnetic layer. In addition, a value of data written in the magnetic resistance memory device 20 may be changed by changing a current direction.

As described above, according to the magnetic resistance memory device 20 of some embodiments, the magnetic tunnel junction device 10 may include the first free layer 15A and the second free layer 15B antiferromagnetic-coupled to the first free layer 15A, and thus the write current may be reduced and the write speed may be increased. In the magnetic resistance memory device 20 of some embodiments, since the first free layer 15A and the second free layer 15B are antiferromagnetic-coupled to each other, a magnetization amount of the entire free layer 15 may be reduced, and thus the write current may be reduced. For example, when the antiferromagnetic coupling constant is low, the write current may be reduced in the region where the damping coefficients of the first and second free layers 15A and 15B are small.

However, the inventive concepts are not limited to the aforementioned embodiments, and some embodiments may be changed or modified without departing from the spirits and scopes of the inventive concepts. For example, in the magnetic resistance memory device 20, other layer(s) not impairing the functions of the layers may be provided between the substrate 11, the buffer layer 12, the pinned layer 13, the insulating layer 14, the free layer 15 and the cap layer 16. For example, a layer for solving lattice mismatch between layers or a layer for removing lattice defects may be added. Other layer not impairing the functions of the layers of the inventive concepts may be provided between the first free layer 15A and the second free layer 15B. Other layer(s) not impairing the functions of the layers of the inventive concepts may be provided between the first free layer 15A, the AFC control layer 15C and the second free layer 15B. In certain embodiments, the free layer 15 may be closer to the substrate 11 than the pinned layer 13.

According to the magnetic tunnel junction device and the magnetic resistance memory device of the embodiments of the inventive concepts, the write current may be reduced and at the same time, the write speed may be increased.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic tunnel junction device comprising:
    a free layer configured to have a first magnetization direction that is changeable;
    a pinned layer that is configured to maintain a second magnetization direction in a predetermined direction; and
    an insulating layer between the free layer and the pinned layer,
    wherein the free layer comprises a first free layer and a second free layer that is antiferromagnetic-coupled to the first free layer, and
    wherein the first free layer has a perpendicular magnetic anisotropy and a high polarizability relative to the second free layer.

2. The magnetic tunnel junction device of claim 1,
    wherein the first free layer is between the insulating layer and the second free layer, and
    wherein a magnetic anisotropy of the second free layer is less than a magnetic anisotropy of the first free layer.

3. The magnetic tunnel junction device of claim 2, further comprising:
    an antiferromagnetic coupling (AFC) control layer configured to control antiferromagnetic coupling between the first free layer and the second free layer.

4. The magnetic tunnel junction device of claim 1,
    wherein the first free layer is between the insulating layer and the second free layer, and
    wherein the second free layer comprises a second thickness that is less than a first thickness of the first free layer.

5. The magnetic tunnel junction device of claim 4, further comprising:
    an antiferromagnetic coupling (AFC) control layer configured to control antiferromagnetic coupling between the first free layer and the second free layer.

6. The magnetic tunnel junction device of claim 1,
    wherein the first free layer is between the insulating layer and the second free layer, and
    wherein the first free layer comprises a first thickness that is less than a second thickness of the second free layer.

7. The magnetic tunnel junction device of claim 6, further comprising:

an antiferromagnetic coupling (AFC) control layer configured to control antiferromagnetic coupling between the first free layer and the second free layer.

8. The magnetic tunnel junction device of claim 1, further comprising:
an antiferromagnetic coupling (AFC) control layer configured to control antiferromagnetic coupling between the first free layer and the second free layer.

9. The magnetic tunnel junction device of claim 8, wherein the AFC control layer comprises a magnetic layer having a thickness less than or equal to 2 nm.

10. The magnetic tunnel junction device of claim 8, wherein the AFC control layer comprises at least one of MnGa, Ru, Ir, MgO, Pt, Co, Pd, W, or Ta.

11. A magnetic resistance memory device comprising:
a magnetic tunnel junction device comprising:
a free layer configured to have a first magnetization direction that is changeable;
a pinned layer that is configured to maintain a second magnetization direction in a predetermined direction; and
an insulating layer between the free layer and the pinned layer; and
an electrode configured to receive a voltage to apply to the magnetic tunnel junction device,
wherein the free layer comprises a first free layer and a second free layer that is antiferromagnetic-coupled to the first free layer, and
wherein the first free layer has a perpendicular magnetic anisotropy and a high polarizability relative to the second free layer.

12. The magnetic resistance memory device of claim 11, wherein the electrode is configured to apply the voltage to the magnetic tunnel junction device changes the first magnetization direction of the free layer.

13. The magnetic resistance memory device of claim 11, wherein the voltage is applied in a direction substantially perpendicular to junction surfaces of the pinned layer and the free layer such that a current flows through the magnetic tunnel junction device by a tunneling effect.

14. The magnetic resistance memory device of claim 11, wherein a value of data written in the magnetic resistance memory device is changed by changing a current direction through the free layer.

15. The magnetic resistance memory device of claim 11, wherein the electrode is configured to apply the voltage between a bit line and a diffusion region of the magnetic resistance memory device.

16. The magnetic resistance memory device of claim 11, further comprising:
an antiferromagnetic coupling (AFC) control layer between the first free layer and the second free layer,
wherein the AFC control layer is configured to control antiferromagnetic coupling between the first free layer and the second free layer.

17. A memory cell of a magnetic resistance memory device, the memory cell comprising:
a magnetic tunnel junction device,
wherein the magnetic tunnel junction device comprises a first layer with high spin polarization and a second layer with perpendicular magnetization relative to the first layer.

18. The memory cell of claim 17,
wherein the memory cell is configured to receive a voltage applied to the magnetic tunnel junction device between a bit line and a first diffusion region of the memory cell.

19. The memory cell of claim 17, further comprising:
an antiferromagnetic coupling (AFC) control layer configured to control antiferromagnetic coupling between the first layer and the second layer.

20. The memory cell of claim 17, further comprising:
a substrate;
a first diffusion region on the substrate, wherein the first diffusion region comprises a drain region;
a second diffusion region comprising a source region;
a contact plug that electrically connects the first diffusion region and the magnetic tunnel junction device; and
a bit line connected to the magnetic tunnel junction device and configured to select the memory cell,
wherein the memory cell is configured to receive a voltage applied to the magnetic tunnel junction device between the bit line and the first diffusion region.

* * * * *